US 6,731,373 B2

(12) United States Patent
Shoji

(10) Patent No.: US 6,731,373 B2
(45) Date of Patent: May 4, 2004

(54) METHOD FOR IMPRINTING A WAFER WITH IDENTIFYING INFORMATION, AND EXPOSING METHOD AND APPARATUS FOR IMPRINTING A WAFER WITH IDENTIFYING INFORMATION

(75) Inventor: Shigeru Shoji, Tokyo (JP)

(73) Assignee: TDK Corporation, Tokyo (JP)

(*) Notice: Subject to any disclaimer, the term of this patent is extended or adjusted under 35 U.S.C. 154(b) by 318 days.

(21) Appl. No.: 09/925,323

(22) Filed: Aug. 10, 2001

(65) Prior Publication Data

US 2002/0031732 A1 Mar. 14, 2002

(30) Foreign Application Priority Data

Aug. 24, 2000 (JP) ........................................ 2000-253652

(51) Int. Cl.[7] .......................... G03B 27/42; G03B 27/32
(52) U.S. Cl. .......................................... 355/53; 355/77
(58) Field of Search ............................ 355/53, 77, 40; 430/5, 20, 22, 30; 438/401

(56) References Cited

U.S. PATENT DOCUMENTS

| 5,049,925 A | * | 9/1991 | Aiton et al. | .................. 355/53 |
| 5,109,149 A | * | 4/1992 | Leung | .................. 219/121.69 |
| 5,175,774 A | * | 12/1992 | Truax et al. | .................. 382/145 |
| 5,329,090 A | * | 7/1994 | Woelki et al. | .......... 219/121.68 |
| 5,721,651 A | | 2/1998 | Kitahara | |
| 5,808,268 A | * | 9/1998 | Balz et al. | ................ 219/121.8 |
| 5,837,963 A | | 11/1998 | Kitahara | |
| 6,312,876 B1 | * | 11/2001 | Huang et al. | ................ 430/323 |

FOREIGN PATENT DOCUMENTS

| JP | A 62-20116 | 1/1987 |
| JP | A 4-102214 | 4/1992 |
| JP | A 4-356717 | 12/1992 |
| JP | A 9-50606 | 2/1997 |

* cited by examiner

Primary Examiner—Russell Adams
Assistant Examiner—D. Ben Esplin
(74) Attorney, Agent, or Firm—Oliff & Berridge, PLC

(57) ABSTRACT

In order to imprint wafer-identifying information on a wafer on which a plurality of thin-film devices are formed in a batch, utilizing a patterned resist layer, an exposure apparatus exposes a resist layer formed on the wafer to light for forming a latent image of the wafer-identifying information. The exposure apparatus allows a mask storage controller and a mask transfer device to select a mask, on which the pattern of a numeral or symbol to be imprinted is drawn, for each digit of the wafer-identifying information and carries out exposure. The exposure apparatus also allows a mask shift controller to change the positional relationship between the wafer and the mask for each digit of the wafer-identifying information so that the numeral or symbol of each digit of the wafer-identifying information is imprinted at a mutually different position.

15 Claims, 11 Drawing Sheets

METHOD FOR IMPRINTING A WAFER WITH IDENTIFYING INFORMATION, AND EXPOSING METHOD AND APPARATUS FOR IMPRINTING A WAFER WITH IDENTIFYING INFORMATION

BACKGROUND OF THE INVENTION

1. Field of the Invention

The present invention relates to a method for imprinting wafer-identifying information, and an exposure method and apparatus for imprinting wafer-identifying information, on wafers on which a plurality of thin-film devices are formed in a batch.

2. Description of the Related Art

Thin-film devices produced by thin-film fabrication technology include semiconductor devices and thin-film magnetic heads and the like. To produce such thin-film devices, a plurality of thin-film devices are formed in a batch on a wafer (substrate) using the thin-film fabrication technology or the like and thereafter this wafer is separated into individual thin-film devices.

Generally, for example, in order to control the fabrication process and to prevent the occurrence of defective devices, each of the aforementioned thin-film devices are provided with wafer-identifying information for identifying a wafer to which the thin-film device belongs and device location information for identifying the position of the thin-film device in the wafer. These pieces of information are imprinted on each wafer before the wafer is separated into individual thin-film devices. However, the step of imprinting the information may be performed before, during, or after the formation of the thin-film devices.

Conventionally, the following two methods have been typically adopted as methods for imprinting wafer-identifying information and device location information on wafers. The following explanations will be given assuming that a wafer is imprinted with, as wafer-identifying information, a wafer identification number that is different from one wafer to another, and, as device location information, a device location number that indicates a position of the thin-film device in a wafer.

According to the first method, device location numbers are imprinted using photolithography and wafer identification numbers are imprinted by laser marking. The first method is explained below with reference to the flowchart of FIG. 11. According to the first method, initially, a predetermined base is coated with a resist to form a resist layer (step S201). Then, using a mask having a pattern of a device location number drawn thereon, this resist layer is exposed in a batch to light for forming a latent image of the device location number (step S202). After the exposure, the resist layer is developed to form a patterned resist layer (step S203). Thereafter, the patterned resist layer may be entirely left unremoved so as to express the device location number with this patterned resist layer. Alternatively, using the patterned resist layer as a mask, the base of the patterned resist layer may be etched by ion milling or the like to imprint the device location number thereon. Then, a wafer identification number is entered to a laser marking apparatus (step S204). Subsequently, using the laser marking apparatus, the wafer identification number is imprinted by means of a laser beam, that is, laser marking is performed (step S205).

The second method employs laser marking to imprint wafer identification numbers and device location numbers.

Now, the second method will be explained below with reference to the flowchart of FIG. 12. According to the second method, a wafer identification number is entered to a laser marking apparatus (step S211). Then, using the laser marking apparatus, a wafer identification number and a device location number are imprinted by means of a laser beam, that is, laser marking is performed (step S212). The device location number is generated in the laser marking apparatus by means of software, for example, so as to correspond to the thin-film device to be imprinted therewith.

The aforementioned first and second methods are described, for example, in Published Unexamined Japanese Patent Application (KOKAI) No. Hei 9-50606.

FIG. 13 is an explanatory view illustrating an exemplary configuration of the laser marking apparatus employed in the aforementioned first and second methods. The laser marking apparatus has an X-Y stage 302, on which a wafer 301 is to be placed, capable of moving in X and Y directions that are orthogonal to each other. The apparatus further has an X-direction position controller 303 for controlling the position of the X-Y stage 302 in the X direction, and a Y-direction position controller 304 for controlling the position of the X-Y stage 302 in the Y direction. The laser marking apparatus further has a laser beam source 305 for emitting a laser beam, a lens 306 for condensing the laser beam emitted from the laser beam source 305, and a mirror 307 for reflecting the laser beam condensed by the lens 306 to irradiate the wafer 301 on the X-Y stage 302 with the reflected laser beam. The laser marking apparatus further has a controller 308 for controlling the X-direction position controller 303, the Y-direction position controller 304, and the laser beam source 305, and has a storage device 309 connected to the controller 308. The storage device 309 stores the position in the wafer 301 to imprint information thereon, and the information to be imprinted on the wafer 301, and provides the controller 308 with these pieces of information as appropriate.

In accordance with the information stored in the storage device 309, the controller 308 of the laser marking apparatus shown in FIG. 13 allows the wafer 301 to be irradiated with the laser beam emitted from the laser beam source 305 while controlling the X-direction position controller 303 and the Y-direction position controller 304 to vary the position of the X-Y stage 302 and the wafer 301 placed thereon. This makes it possible to imprint the wafer identification number and the device location number at the predetermined position on each thin-film device in the wafer 301. Instead of varying the position of the X-Y stage 302 and the wafer 301, the laser beam may be moved by moving mirror 307, for example.

In both the first and second methods, at least wafer identification numbers are imprinted by laser marking, on the thin-film devices of a wafer one by one. Accordingly, there is a problem that much time is required for imprinting the information including the wafer identification number, and the time required for imprinting the information would increase as the number of thin-film devices on a wafer increases. In particular, in the case where the thin-film device is a thin-film magnetic head, the size of a wafer tends to increase while the thin-film device decreases in size. For this reason, it is conceivable that the number of thin-film devices in a wafer will become greater in the future and the time required for imprinting information such as wafer identification numbers per wafer will increase accordingly.

For example, suppose that information such as wafer identification number is imprinted by laser marking and that 0.5 seconds are required for imprinting on each thin-film device. In this case, for a 3-inch (76.2 mm) wafer having 4,000 thin-film devices formed thereon, 2,000 seconds (about 33 minutes) would be required for imprinting on each wafer. For a 6-inch (152.4 mm) wafer having 16,000 thin-film devices formed thereon, 8,000 seconds (about 2 hours and 13 minutes) would be required for imprinting on each wafer.

Device location numbers are not different among wafers having the same type of thin-film devices formed thereon. Accordingly, for such wafers, it is possible to imprint device location numbers through photolithography using a common mask on which the device location number is drawn, as in the first method. In the first method, the device location number is imprinted through photolithography, which saves the time required for laser marking. However, it requires an additional step of performing photolithography to imprint the device location number.

Published Unexamined Japanese Patent Application (KOKAI) No. Sho 62-20116 discloses a technique for imprinting device location numbers in a batch on all the devices in a thin-film magnetic head substrate, using photolithography. However, no description is found in this publication about imprinting wafer identification numbers.

Published Unexamined Japanese Patent Application (KOKAI) No. Hei 4-102214 discloses a technique for imprinting device location numbers and wafer identification numbers in a batch on a thin-film magnetic head substrate, using photolithography. However, this technique presents a problem that it requires masks for exposure as many as the number of varieties of the wafer identification numbers, thereby raising the manufacturing cost of the devices.

Published Unexamined Japanese Patent Application (KOKAI) No. Hei 4-356717 discloses a technique for imprinting a group of symbols on a thin-film magnetic head substrate using a photomask for forming a plurality of symbols and a photomask for erasing any of the plurality of symbols. This technique expresses information by the combination of the presence and absence of a plurality of symbols, and therefore there is a problem that the varieties of expressible information is smaller in number, for the number of symbols. On the other hand, the aforementioned Published Unexamined Japanese Patent Application (KOKAI) No. Hei 4-356717 describes that only two photomasks are required. However, the technique disclosed in this publication requires the erasing photomasks as many as the number that is obtained by subtracting 1 from the number of varieties of expressible information. Therefore, it also presents the problem of raising the manufacturing cost of the devices.

OBJECT AND SUMMARY OF THE INVENTION

It is therefore an object of the present invention to provide a method for imprinting wafer-identifying information and an exposure method and apparatus for imprinting wafer-identifying information, capable of imprinting wafer-identifying information on wafers on which a plurality of thin-film devices are formed in a batch, in a short time and without requiring a number of exposure masks.

The present invention provides a method for imprinting wafer-identifying information on wafers each having a plurality of thin-film devices formed thereon in a batch, using a patterned resist layer. The wafer-identifying information includes a plurality of digits, each digit being expressed with a numeral or a symbol. The method comprises the steps of: selecting a wafer to be imprinted with the wafer-identifying information; forming a resist layer on the selected wafer; exposing the resist layer, using a mask, to light for forming a latent image of the wafer-identifying information; and forming the patterned resist layer by developing the exposed resist layer. In the step of exposing the resist layer, a mask on which a pattern of a numeral or the symbol to be imprinted is drawn thereon is selected for each digit of the wafer-identifying information in which the numeral or the symbol is changeable wafer by wafer.

According to the method for imprinting wafer-identifying information of the present invention, a mask on which a pattern of a numeral or the symbol to be imprinted is drawn thereon is selected for each digit of the wafer-identifying information in which the numeral or the symbol is changeable wafer by wafer, and exposure is performed using the selected mask.

In the method for imprinting wafer-identifying information of the present invention, in the step of exposing the resist layer, the selection of a mask on which the pattern of a numeral or the symbol to be imprinted is drawn thereon and the exposure using the selected mask may be repeated as many times as the number of digits of the wafer-identifying information, so that exposure is performed for all digits of the wafer-identifying information.

In the method for imprinting wafer-identifying information of the present invention, in the step of exposing the resist layer, the resist layer may be further exposed to light for forming a latent image of device location information for identifying a position of a thin-film device in the wafer, using a mask on which a pattern of the device location information is drawn thereon.

Furthermore, in the method for imprinting wafer-identifying information of the present invention, the numeral or symbol of each digit of the wafer-identifying information may vary in accordance with a certain rule in response to change of one selected wafer to another, and, in the step of exposing the resist layer, one selected mask may be changed to another in response to the change of one selected wafer to another in such a manner as to correspond to the rule of the variation of the numeral or symbol of each digit of the wafer-identifying information.

Furthermore, in the method for imprinting wafer-identifying information of the present invention, in step of exposing the resist layer, a positional relationship between the mask and the wafer may be changed for each digit of the wafer-identifying information, so that the numeral or symbol of each digit of the wafer-identifying information is imprinted at a mutually different position.

Furthermore, the method for imprinting wafer-identifying information of the present invention may further comprise the step of etching a layer underlying the patterned resist layer, using the patterned resist layer as an etching mask.

Furthermore, the method for imprinting wafer-identifying information of the present invention may further comprise the step of forming a plating layer by performing plating with the patterned resist layer used as a frame.

The present invention also provides an exposure method for imprinting wafer-identifying information. The exposure method is used for imprinting wafer-identifying information on wafers each having a plurality of thin-film devices formed thereon in a batch, using a patterned resist layer, the wafer-identifying information including a plurality of digits, each digit being expressed with a numeral or a symbol. The exposure method exposes the patterned resist layer formed on the wafer to light for forming a latent image of the wafer-identifying information, and comprises the steps of: selecting a wafer to be imprinted with the wafer-identifying information, and exposing the resist layer of the selected wafer, using a mask, to the light for forming the latent image of the wafer-identifying information. In the step of exposing the resist layer, exposure is performed for each digit of the wafer-identifying information in which the numeral or the symbol is changeable wafer by wafer, by selecting a mask on which a pattern of a numeral or the symbol to be imprinted is drawn thereon for each digit.

In the exposure method for imprinting wafer-identifying information according to the present invention, a mask on which a pattern of a numeral or the symbol to be imprinted is drawn thereon is selected for each digit of the wafer-identifying information in which the numeral or the symbol is changeable wafer by wafer, and exposure is performed using the selected mask.

In the exposure method for imprinting wafer-identifying information according to the present invention, in the step of exposing the resist layer, the selection of a mask on which the pattern of a numeral or the symbol to be imprinted is drawn thereon and the exposure using the selected mask may be repeated as many times as the number of digits of the wafer-identifying information, so that exposure is performed for all digits of the wafer-identifying information.

Furthermore, in the exposure method for imprinting wafer-identifying information according to the present invention, in the step of exposing the resist layer, the resist layer may be further exposed to light for forming a latent image of device location information for identifying a position of a thin-film device in the wafer, using a mask on which a pattern of the device location information is drawn thereon.

Furthermore, in the exposure method for imprinting wafer-identifying information according to the present invention, the numeral or symbol of each digit of the wafer-identifying information may vary in accordance with a certain rule in response to change of one selected wafer to another, and, in the step of exposing the resist layer, one selected mask may be changed to another in response to the change of one selected wafer to another in such a manner as to correspond to the rule of the variation of the numeral or symbol of each digit of the wafer-identifying information.

Furthermore, in the exposure method for imprinting wafer-identifying information according to the present invention, in step of exposing the resist layer, a positional relationship between the mask and the wafer may be changed for each digit of the wafer-identifying information, so that the numeral or symbol of each digit of the wafer-identifying information is imprinted at a mutually different position.

The present invention also provides an exposure apparatus for imprinting wafer-identifying information. The exposure apparatus is used for imprinting wafer-identifying information using a patterned resist layer on wafers each having a plurality of thin-film devices formed thereon in a batch, the wafer-identifying information including a plurality of digits, each digit being expressed with a numeral or a symbol. The exposure apparatus exposes the patterned resist layer formed on the wafer to light for forming a latent image of the wafer-identifying information, and comprises: a wafer selecting device for selecting a wafer to be imprinted with the wafer-identifying information, and an exposure device for exposing the resist layer of the wafer selected by the wafer selecting device, using a mask, to the light for forming the latent image of the wafer-identifying information. The exposure device has a mask selecting device for selecting a mask on which a pattern of a numeral or symbol to be imprinted is drawn thereon for each digit of the wafer-identifying information in which the numeral or the symbol is changeable wafer by wafer.

According to the exposure apparatus for imprinting wafer-identifying information of the present invention, a mask on which a pattern of a numeral or the symbol to be imprinted is drawn thereon is selected for each digit of the wafer-identifying information in which the numeral or the symbol is changeable wafer by wafer, and exposure is performed using the selected mask.

In the exposure apparatus for imprinting wafer-identifying information according to the present invention, the exposure device may repeat the selection of a mask on which the pattern of a numeral or the symbol to be imprinted is drawn thereon and the exposure using the selected mask as many times as the number of digits of the wafer-identifying information, so as to perform exposure for all digits of the wafer-identifying information.

Furthermore, in the exposure apparatus for imprinting wafer-identifying information according to the present invention, the exposure device may further expose the resist layer to light for forming a latent image of device location information for identifying a position of a thin-film device in the wafer, using a mask on which a pattern of the device location information is drawn thereon.

Furthermore, in the exposure apparatus for imprinting wafer-identifying information according to the present invention, the numeral or symbol of each digit of the wafer-identifying information may vary in accordance with a certain rule in response to change of one selected wafer to another, and, the mask selecting device may change one selected mask to another in response to the change of one selected wafer to another in such a manner as to correspond to the rule of the variation of the numeral or symbol of each digit of the wafer-identifying information.

Furthermore, in the exposure apparatus for imprinting wafer-identifying information according to the present invention, the exposure device may further have a position changing device for changing a positional relationship between the mask and the wafer for each digit of the wafer-identifying information, so that the numeral or symbol of each digit of the wafer-identifying information is imprinted at a mutually different position.

Other objects, features, and advantages of the present invention will be apparent from the following description.

DETAILED DESCRIPTION OF THE PREFERRED EMBODIMENTS

A preferred embodiment of the invention will now be described in detail with reference to the accompanying drawings.

Figure 3:
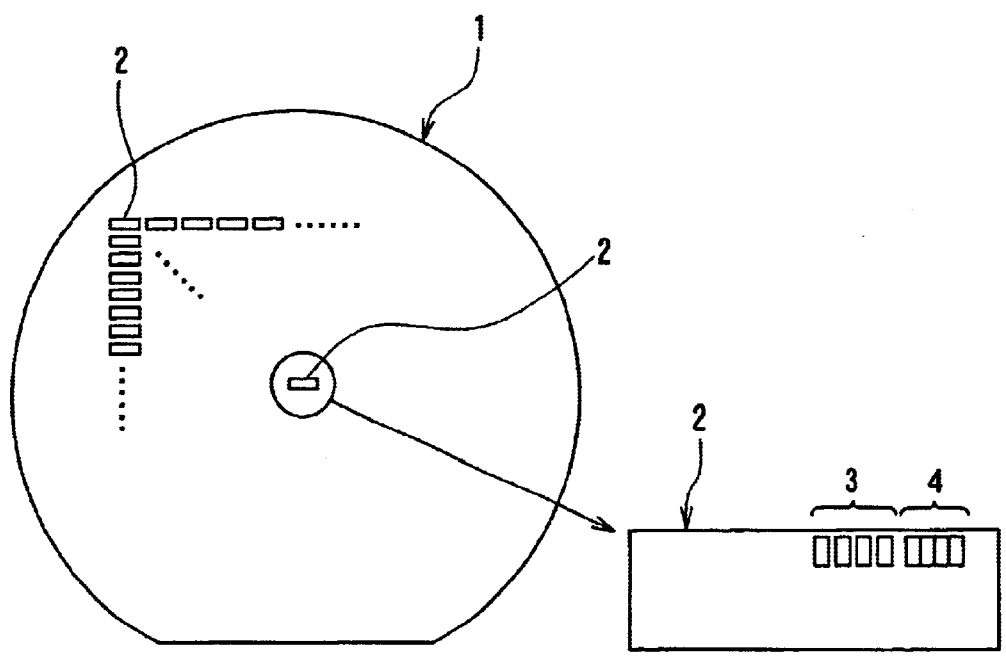
FIG. 3 is an explanatory view illustrating a wafer to which the embodiment of the invention is applied and the information to be imprinted thereon.

To begin with, referring to FIG. 3, description will be given as to a wafer to which a method for imprinting wafer-identifying information and an exposure method and apparatus for imprinting wafer-identifying information according to an embodiment of the invention are applied, and as to the information to be imprinted on the wafer. As shown in FIG. 3, a wafer 1, to which the present embodiment is applied, has a plurality of thin-film devices (hereinafter simply referred to as "device(s)") 2 that are formed thereon in a batch. One of the devices 2 is shown under magnification in FIG. 3. As shown, wafer-identifying information 3 and device location information 4 are imprinted at same positions respectively on each device 2. The devices 2 may be semiconductor devices or micro-devices such as thin-film magnetic heads.

The wafer-identifying information 3 serves to identify a wafer and includes a plurality of digits, each digit being expressed with a numeral or a symbol. The wafer-identifying information 3 varies from one wafer 1 to another.

The device location information 4 serves to identify a position of each device 2 in the wafer 1 and includes a plurality of digits, each digit being expressed with a numeral or a symbol. The device location information 4 varies from one device 2 to another. However, for a plurality of wafers 1 having the same type of devices 2 formed thereon, the device location information 4 is not different from wafer to wafer.

Now, referring to FIG. 1, described below is the configuration of an exposure apparatus for imprinting wafer-identifying information (hereinafter also referred to simply as "exposure apparatus") according to the present embodiment. The exposure apparatus comprises a light source 11 for emitting light for exposure, a wafer stage 12 on which a wafer 1 is placed, and a mask stage 13 which is disposed between the light source 11 and the wafer stage 12 and on which a mask 30 is placed. The exposure apparatus further comprises an optical assembly 14 such as a compound condensing lens disposed between the light source 11 and the mask stage 13, and an exposure lens 15 disposed between the mask stage 13 and the wafer stage 12. The optical assembly 14 irradiates the mask 30 placed on the mask stage 13 with the light emitted from the light source 11. The exposure lens 15 projects the pattern drawn on the mask 30 onto the wafer 1 placed on the wafer stage 12.

The exposure apparatus further comprises a wafer storage device 16 for storing a plurality of wafers 1, a wafer storage controller 17 for controlling the position of the wafer storage device 16, and a wafer transfer device 18 for moving a wafer 1 between the wafer storage device 16 and the wafer stage 12. The wafer storage controller 17 works to set the storage position of a given wafer 1 in the storage device 16 to the place where the wafer 1 is unloadable from and loadable into the storage device 16. The wafer transfer device 18 unloads a wafer 1 from its storage position in the storage device 16, the storage position having been set to the place where the wafer 1 is loadable and unloadable, so as to place the wafer 1 on the wafer stage 12. Furthermore, the wafer transfer device 18 unloads the wafer 1 from the wafer stage 12 to store the same into the above-mentioned storage position.

The exposure apparatus further comprises a mask storage device 21 for storing a plurality of masks 30, a mask storage controller 22 for controlling the position of the mask storage device 21, and a mask transfer device 23 for moving a mask 30 between the mask storage device 21 and the mask stage 13. The mask storage controller 22 works to set the storage position of a given mask 30 in the mask storage device 21 to the place where the mask 30 is unloadable from and loadable into the storage device 21. The mask transfer device 23 unloads a mask 30 from its storage position in the storage device 21, the storage position having been set to the place where the mask 30 is loadable and unloadable, so as to place the mask 30 on the mask stage 13. Furthermore, the mask transfer device 23 unloads the mask 30 from the mask stage 13 to store the same into the above-mentioned storage position.

The exposure apparatus further comprises a mask shift controller 24, a controller 25, and a counter 26 connected to the controller 25. The mask shift controller 24 changes a position of the mask stage 13 in the direction perpendicular to the optical axis of the exposure light, so as to change a position of a mask 30 placed on the mask stage 13 in the same direction. The controller 25 controls the wafer storage controller 17, the wafer transfer device 18, the mask storage controller 22, the mask transfer device 23, and the mask shift controller 24. For example, the controller 25 incorporates a computer.

The controller 25 provides the wafer storage controller 17 and the wafer transfer device 18 with an instruction to change a wafer 1. The instruction to change a wafer 1 includes an instruction to unload a wafer 1 to be subjected to exposure from the storage device 16 to place the same on the wafer stage 12, and an instruction to unload the exposed wafer 1 from the wafer stage 12 to store the same in the storage device 16.

The controller 25 also provides the mask storage controller 22 and the mask transfer device 23 with an instruction to change a mask 30. The instruction to change a mask 30 includes an instruction to unload a mask 30 to be used for exposure from the storage device 21 to place the same on the mask stage 13, and an instruction to unload the mask 30, after having been used, from the mask stage 13 to store the same in the storage device 21.

Furthermore, the controller 25 provides the mask shift controller 24 with an instruction to adjust the position of the mask 30.

The count value of the counter 26 is set to an initial value when exposing a first wafer 1. Thereafter, upon receiving information on change of a wafer from the controller 25, the counter 26 increments or decrements the count value. The counter 26 also provides the count value as wafer-identifying information to the controller 25.

Figure 1:
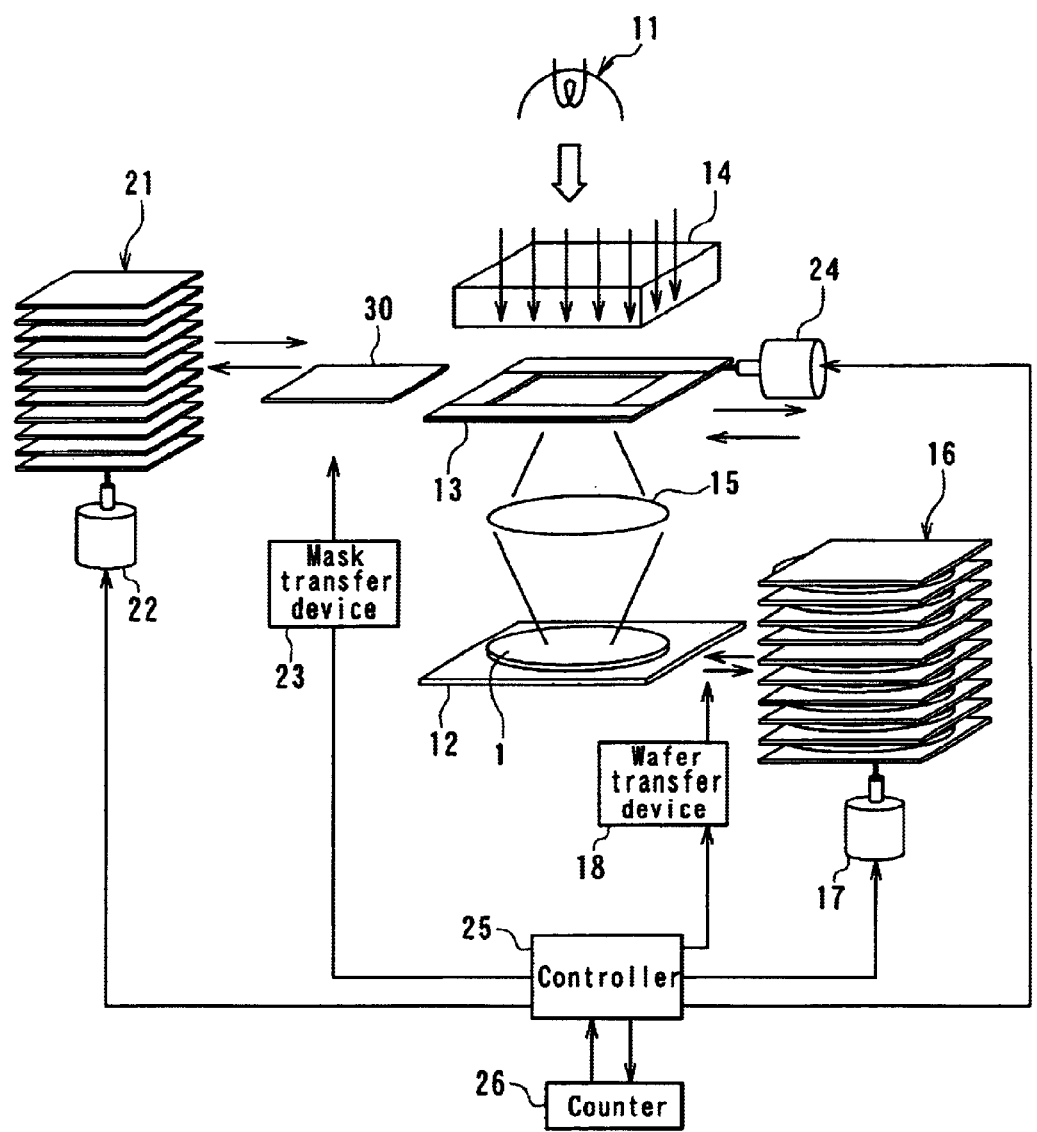
FIG. 1 is an explanatory view illustrating the configuration of an exposure apparatus for imprinting wafer-identifying information according to an embodiment of the invention.

In the exposure apparatus shown in FIG. 1, the wafer storage device 16, the wafer storage controller 17, the wafer transfer device 18, and the controller 25 correspond to a wafer selecting device of the invention. Additionally, in the exposure apparatus shown in FIG. 1, components other than the wafer storage device 16, the wafer storage controller 17, and the wafer transfer device 18 correspond to an exposure device of the invention. Moreover, the mask storage device 21, the mask storage controller 22, the mask transfer device 23, and the controller 25 correspond to a mask selecting device of the invention. Furthermore, the mask shift controller 24 and the controller 25 correspond to a position changing device of the invention.

Figure 2:
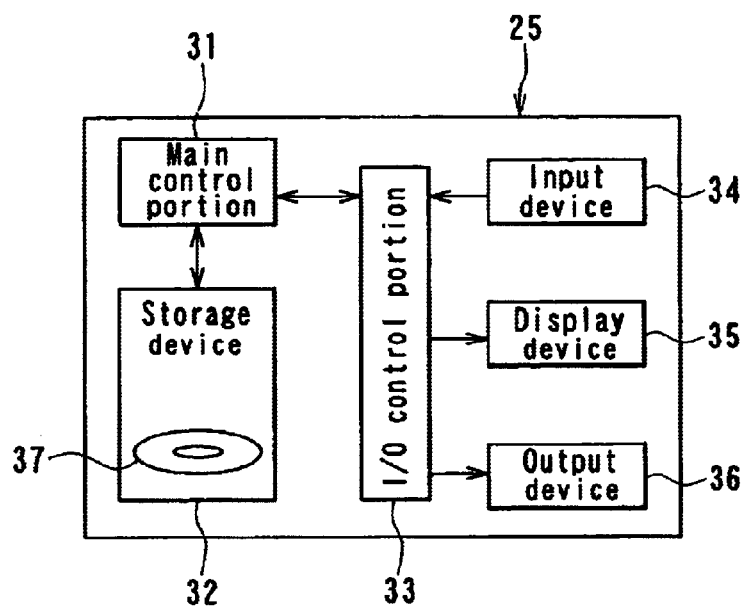
FIG. 2 is a block diagram illustrating an exemplary configuration of the controller of FIG. 1.

FIG. 2 is a block diagram illustrating an exemplary configuration of the controller 25. The controller 25 of this example comprises a main control portion 31, a storage device 32 connected to the main control portion 31, an I/O control portion 33 connected to the main control portion 31, an input device 34 connected to the I/O control portion 33, a display device 35, and an output device 36. The main control portion 31 has a CPU (Central Processing Unit), a ROM (Read Only Memory), and a RAM (Random Access Memory). Any type of device may be employed as the storage device 32 so long as the device can store information. For example, the storage device 32 may be a hard disk drive, an optical disk drive, a floppy disk drive or the like. The storage device 32 stores information on a storage medium 37 and reads information from the storage medium 37. Any type of medium may be employed as the storage medium 37 so long as the medium can store information. For example, the storage medium 37 may be a hard disk, an optical disk, a floppy disk or the like.

The CPU in the main control portion 31 employs the RAM of the main control portion 31 as a work area to execute a program stored on the storage medium 37 or in the ROM of the main control portion 31, thereby functioning as the controller 25.

Now, a method for imprinting wafer-identifying information according to the present embodiment will be described. The method for imprinting wafer-identifying information includes an exposure method for imprinting wafer-identifying information according to the embodiment. The method for imprinting wafer-identifying information comprises the step of selecting a wafer on which the wafer-identifying information is to be imprinted, and the step of imprinting the wafer-identifying information on the selected wafer using a patterned resist layer. For imprinting the wafer-identifying information, for example, the patterned resist layer may be used as an etching mask to etch a layer underlying this resist layer, or the patterned resist layer may be used as a frame to perform plating, thereby forming a plating layer. On the other hand, according to the present embodiment, device location information is also imprinted using the patterned resist layer in the step of imprinting the wafer-identifying information using the patterned resist layer. The step of imprinting the wafer-identifying information and device location information may be carried out before, during, or after the device 2 is formed.

Figure 4:
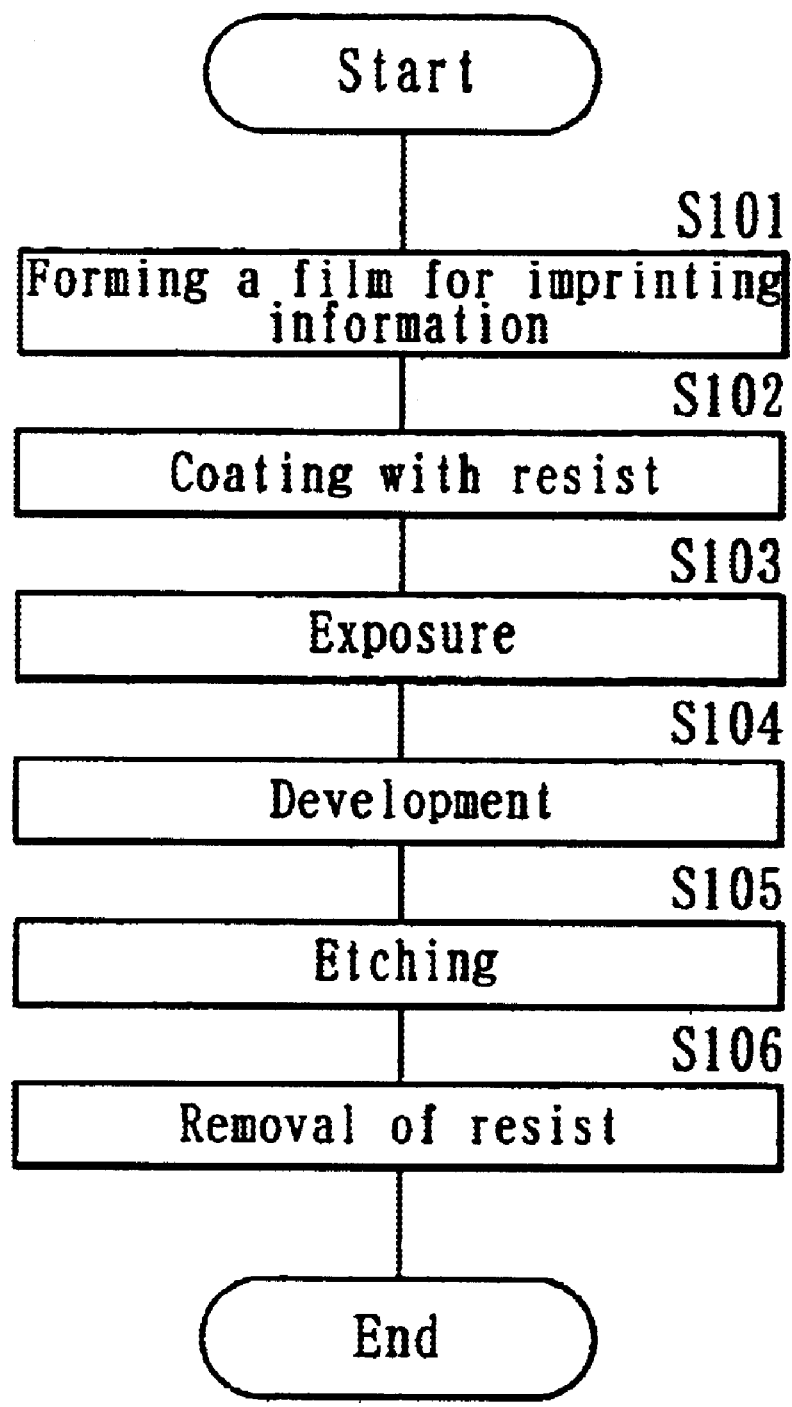
FIG. 4 is a flowchart illustrating an example of a process of imprinting wafer-identifying information in accordance with a method for imprinting wafer-identifying information according to the embodiment of the invention.

Reference is now made to FIG. 4 and FIGS. 5A to 5F to describe the step of imprinting wafer-identifying information through etching the layer underlying the patterned resist layer. FIG. 4 is a flowchart illustrating the steps for imprinting wafer-identifying information in this case, and FIGS. 5A to 5F are explanatory views illustrating the steps shown in FIG. 4.

Figure 5A:
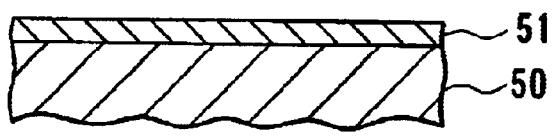
FIG. 5A to FIG. 5F are explanatory views illustrating the process shown in FIG. 4.
Figure 5B:
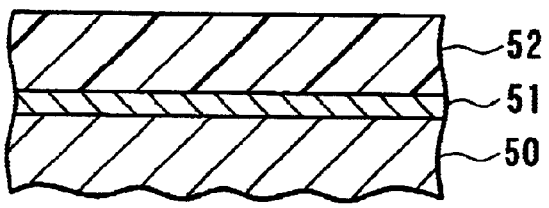
Figure 5C:
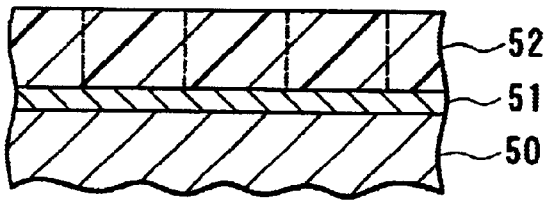

In the step shown in FIG. 4 and FIGS. 5A to 5F, a film 51 to be used for imprinting wafer-identifying information is first formed on a predetermined layer 50 that is formed on a wafer, as shown in step S101 of FIG. 4 and FIG. 5A. The film 51 may be a metal film. It is preferable that the film 51 is different in optical reflectivity from the layer 50 underlying the film 51. Then, as shown in step S102 of FIG. 4 and FIG. 5B, the film 51 is coated with a resist to form a resist layer 52. Then, as shown in step S103 of FIG. 4 and FIG. 5C, multiple exposure of the resist layer 52 is carried out to light for forming a latent image of wafer-identifying information and light for forming a latent image of device location information, using a mask for one digit of wafer-identifying information and a mask for device location information, while changing the masks from one to another.

If the resist layer 52 is formed of a negative resist, used as the mask for wafer-identifying information and the mask for device location information are those which allow light to pass through a portion corresponding to the shape of each numeral or symbol constituting the wafer-identifying information and the device location information, and which interrupt light at the other portion.

On the other hand, if the resist layer 52 is formed of positive resist, used as the mask for wafer-identifying information is a mask that has an interrupting portion, the interrupting portion having such a pattern as to interrupt light at a portion corresponding to the shape of each numeral or symbol constituting the wafer-identifying information in a one-digit region that surrounds the numeral or symbol; to allow light to pass through the other portion in the aforementioned region; and to interrupt light, at the time of exposure for any digit of the wafer-identifying information, at least at portions corresponding to other digits and at a portion corresponding to the exposure position of the device location information. For example, the light-interrupting portion may have such a pattern as to interrupt light at the portion corresponding to the shape of each numeral or symbol in the aforementioned region, transmit light through the other portion in the aforementioned region, and interrupt light at the portion outside the aforementioned region.

Additionally, if the resist layer 52 is formed of a positive resist, used as the mask for device location information is a mask that has an interrupting portion, the interrupting portion having a such pattern as to interrupt light at a portion corresponding to the shape of each numeral or symbol constituting the device location information in a region for a plurality of digits that surrounds each numeral or symbol; to allow light to pass through the other portion in the aforementioned region; and to interrupt light at least at a portion corresponding to the exposure position of the wafer-identifying information. For example, the interrupting portion may have such a pattern as to interrupt light at the portion corresponding to the shape of each numeral or symbol in the aforementioned region, transmit light through the other portion in the aforementioned region, and interrupt light at the portion outside the aforementioned region.

The aforementioned exposure step (step S103) is carried out using the exposure apparatus for imprinting wafer-identifying information according to the present embodiment. This step will be described in more detail later.

Figure 5D:
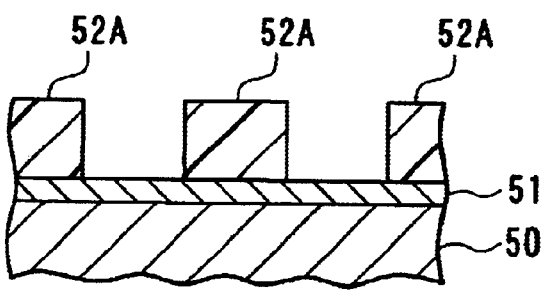
Figure 5E:
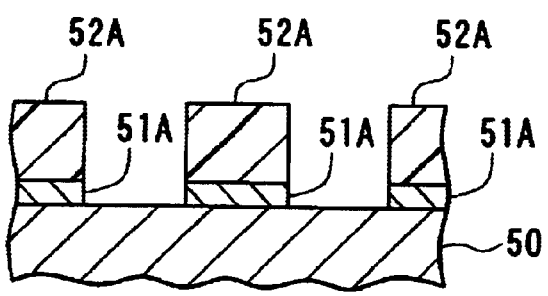
Figure 5F:
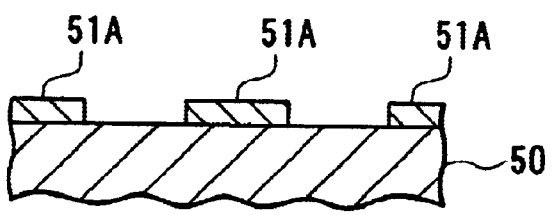

Subsequently, as shown in step S104 of FIG. 4 and FIG. 5D, the resist layer 52 is developed after having been exposed, to form a patterned resist layer 52A. Then, as shown in step S105 of FIG. 4 and FIG. 5E, using the patterned resist layer 52A as an etching mask, the film 51 that is the layer underlying the patterned resist layer 52A is etched to form a patterned film 51A for imprinting information. Finally, as shown in step S106 of FIG. 4 and FIG. 5F, the resist layer 52A is removed. This allows the patterned film 51A to express the wafer-identifying information and the device location information.

In the steps shown in FIG. 4 and FIGS. 5A to 5F, a film for forming an index may be used as the film 51, the index being used to position the wafer 1 when forming each of the films making up the devices 2 on the wafer 1, and the wafer-identifying information and the device location information may be imprinted at the same time as the formation of the index.

Figure 6:
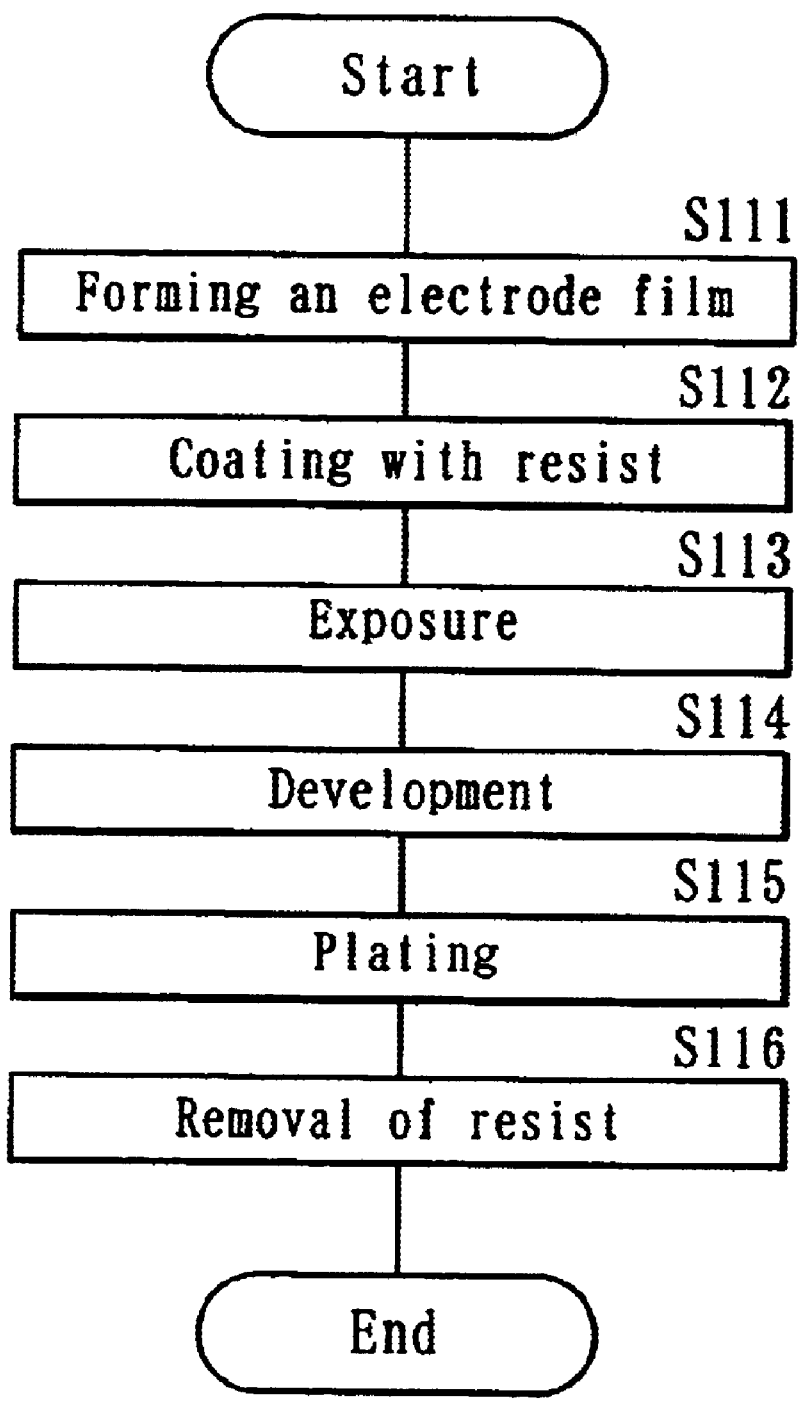
FIG. 6 is a flowchart illustrating another example of a process of imprinting wafer-identifying information in accordance with the method for imprinting wafer-identifying information according to the embodiment of the invention.

Reference is now made to FIG. 6 and FIGS. 7A to 7F to describe the step of imprinting wafer-identifying information through forming a plating layer using the patterned resist layer as a frame for plating. FIG. 6 is a flowchart illustrating the steps for imprinting wafer-identifying information in this case, and FIGS. 7A to 7F are explanatory views illustrating the steps shown in FIG. 6.

Figure 7A:
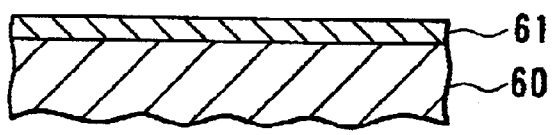
FIG. 7A to FIG. 7F are explanatory views illustrating the process shown in FIG. 6.
Figure 7B:
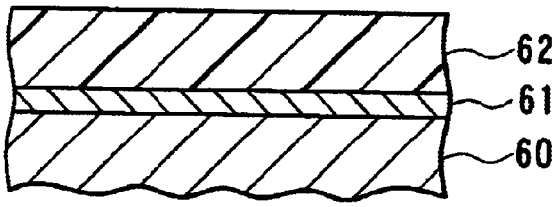
Figure 7C:
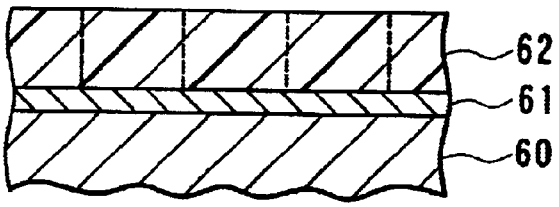

In the step shown in FIGS. 6 and FIGS. 7A to 7F, an electrode film 61 for plating is first formed on a predetermined layer 60 that is formed on a wafer, as shown in step S111 of FIG. 6 and FIG. 7A. Then, as shown in step S112 of FIG. 6 and FIG. 7B, the electrode film 61 is coated with a resist to form a resist layer 62. Then, as shown in step S113 of FIG. 6 and FIG. 7C, multiple exposure of the resist layer 62 is carried out to light for forming a latent image of wafer-identifying information and to light for forming a latent image of device location information, using a mask for one digit of wafer-identifying information and a mask for device location information while changing the masks from one to another.

If the resist layer 62 is formed of a positive resist, used as the mask for wafer-identifying information and the mask for device location information are those which allow light to pass through a portion corresponding to the shape of each numeral or symbol that constitutes the wafer-identifying information and the device location information, and which interrupt light at the other portion.

On the other hand, if the resist layer 62 is formed of a negative resist, used as the mask for wafer-identifying information is a mask that has an interrupting portion, the interrupting portion having such a pattern as to interrupt light at a portion corresponding to the shape of each numeral or symbol constituting the wafer-identifying information in a one-digit region that surrounds the numeral or symbol; to allow light to pass through the other portion in the aforementioned region; and to interrupt light, at the time of exposure for any digit of the wafer-identifying information, at least at portions corresponding to other digits and at the portion corresponding to the exposure position of the device location information. For example, the light-interrupting portion may have such a pattern as to interrupt light at the portion corresponding to the shape of each numeral or symbol in the aforementioned region, transmit light through the other portion in the aforementioned region, and interrupt light at the portion outside the aforementioned region.

Additionally, if the resist layer 62 is formed of a negative resist, used as the mask for device location information is a mask that has an interrupting portion, the interrupting portion having such a pattern as to interrupt light at a portion corresponding to the shape of each numeral or symbol constituting the device location information in a region for a plurality of digits that surrounds each numeral or symbol; to allow light to pass through the other portion in the aforementioned region; and to interrupt light at least at a portion corresponding to the exposure position of the wafer-identifying information. For example, the interrupting portion may have such a pattern as to interrupt light at the portion corresponding to the shape of each numeral or symbol in the aforementioned region, transmit light through the other portion in the aforementioned region, and interrupt light at the portion outside the aforementioned region.

The aforementioned exposure step (step S113) is carried out using the exposure apparatus for imprinting wafer-identifying information according to the present embodiment. This process will be described in more detail later.

Figure 7D:
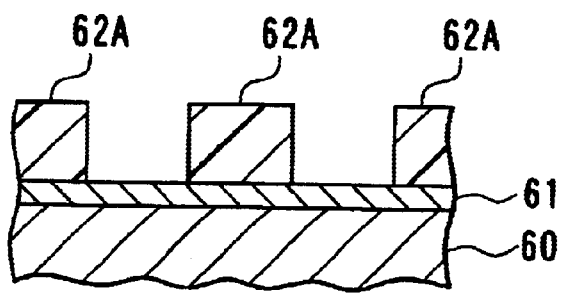
Figure 7E:
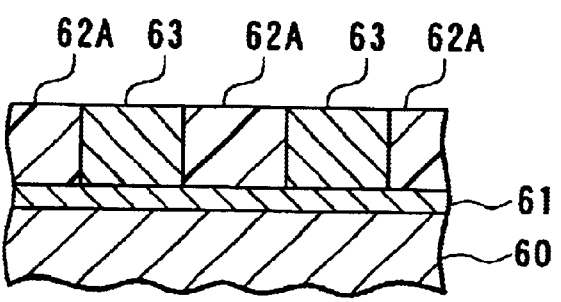
Figure 7F:
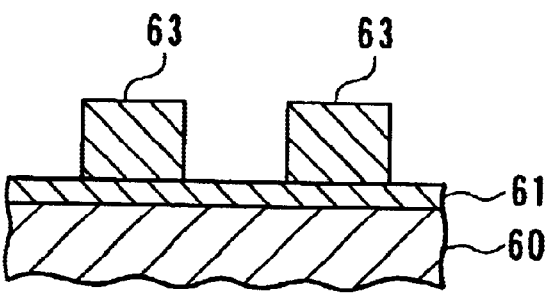

Subsequently, as shown in step S114 of FIG. 6 and FIG. 7D, the resist layer 62 is developed after having been exposed, to form a patterned resist layer 62A. Then, as shown in step S115 of FIG. 6 and FIG. 7E, plating is performed using the patterned resist layer 62A as a frame, to form a plating layer 63. Finally, as shown in step S116 of FIG. 6 and FIG. 7F, the resist layer 62A is removed. This allows the plating layer 63 to express the wafer-identifying information and the device location information.

In the steps shown in FIG. 6 and FIGS. 7A to 7F, at the same time as imprinting the wafer-identifying information and the device location information, an index may be formed using the plating layer 63, the index being used to position the wafer 1 when forming each of the films making up the devices 2 on the wafer.

Reference is now made to FIG. 8 and FIGS. 9A to 9E to describe the functions of the exposure method and apparatus for imprinting wafer-identifying information according to the present embodiment.

Figure 8:
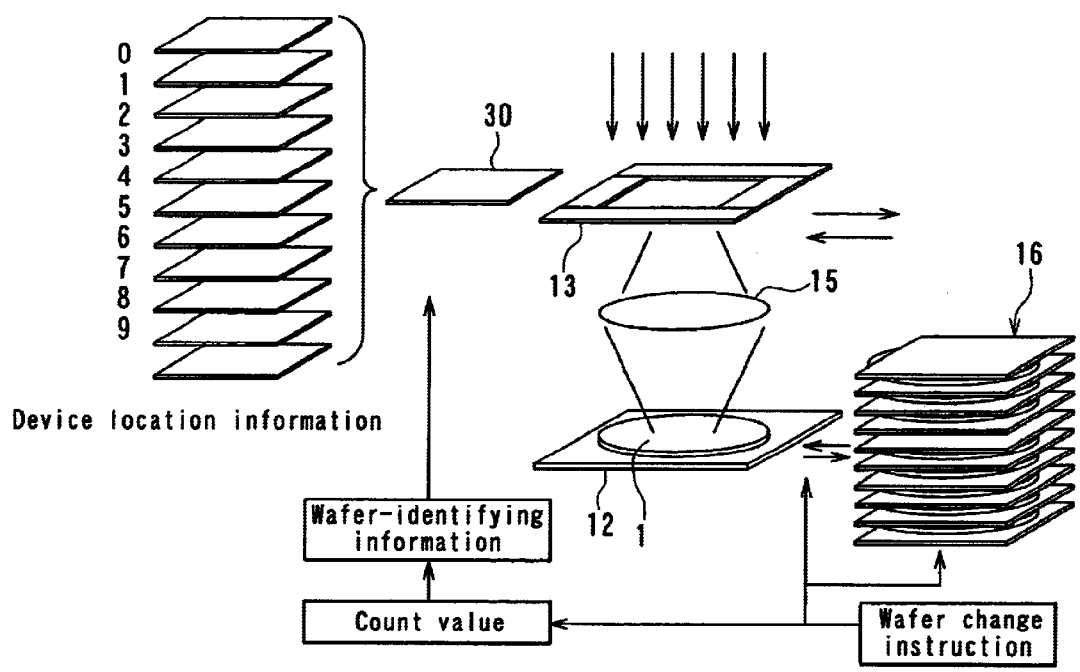
FIG. 8 is an explanatory view illustrating the functions of the exposure apparatus and an exposure method for imprinting wafer-identifying information according to the embodiment of the invention.

As shown in FIG. 8, the exposure method for imprinting wafer-identifying information according to the embodiment comprises the step of selecting a wafer 1 on which the wafer-identifying information is to be imprinted, and the step of exposing the resist layer formed on the selected wafer 1 to light for forming a latent image of the wafer-identifying information using the mask 30. The step of exposing the resist layer corresponds to step S103 of FIG. 4 and step S113 of FIG. 6. According to this embodiment, in the step of exposing the resist layer to the light for forming the latent image of the wafer-identifying information, the resist layer is also exposed to light for forming a latent image of the device location information.

In the step of exposing the resist layer in this embodiment, exposure is performed for each of digits of the wafer-identifying information in which the numeral or the symbol is changeable wafer by wafer, by selecting a mask on which a pattern of a numeral or the symbol to be imprinted is drawn thereon for each digit.

The following explanations are given assuming that the wafer-identifying information is expressed as a base-M number consisting of N digits. In this case, as the mask for wafer-identifying information, prepared are M masks having patterns of numerals or symbols indicative of 0 to (M−1) respectively. Each mask has the numeral or symbol drawn as many as the number of the devices 2 drawn thereon, so that the mask can provide the same array as that of the devices 2 of the wafer 1 when projected thereon. Accordingly, in this embodiment, selection of a mask on which the pattern of a numeral or symbol to be imprinted is drawn and exposure using the selected mask are repeated for the same number of times as the number of digits of the wafer-identifying information, that is, N times, thereby performing exposure for all the digits of the wafer-identifying information.

On the other hand, in this embodiment, a single mask for exposing the resist layer to light for forming the latent image of the device location information is prepared, in addition to the aforementioned M masks for exposing the resist layer to light for forming the latent image of the wafer-identifying information. Then, in the step of exposing the resist layer to light for forming the latent image of the wafer-identifying information, the resist layer is also exposed to light for forming the latent image of the device location information, using the mask mentioned above. Accordingly, in the step of exposing the resist layer to light for forming the latent image of wafer-identifying information, selection of a mask and exposure using the selected mask are repeated (N+1) times in total. Multiple exposure of the resist layer to light for forming the latent image of the wafer-identifying information and to light for forming the latent image of the device location information is thereby performed.

FIG. 8 shows an example in which the wafer-identifying information is expressed as a base-ten number. In this case, as the mask for the wafer-identifying information, prepared are 10 masks having patterns of numerals or symbols indicative of 0 to 9 respectively. In addition to those masks, one mask for device location information is prepared.

In this embodiment, the numeral or symbol of each digit of the wafer-identifying information varies in accordance with a certain rule in response to change of one selected wafer 1 to another. For example, the numeral or symbol may vary such that the number expressed by the entire wafer-identifying information increases or decreases by one, each time one selected wafer 1 is changed to another.

The exposure apparatus according to this embodiment, whose functions are shown briefly in FIG. 8, allows the wafer storage controller 17 and the wafer transfer device 18 to change one selected wafer 1 to another in response to the instruction from the controller 25 to change wafer. Additionally, in response to the instruction from the controller 25 to change wafer, the count value of the counter 26 indicative of the wafer-identifying information is incremented or decremented. The wafer-identifying information (count value) is entered into the controller 25, which in turn controls the mask storage controller 22 and the mask transfer device 23 in response to the wafer-identifying information. Then, the mask storage controller 22 and the mask transfer device 23 work to change one selected mask 30 to another for each digit of the wafer-identifying information, in such a manner as to correspond to the rule of the variation in the numeral or symbol of each digit of the wafer-identifying information. Then, using the selected mask 30, carried out is the exposure to light for forming the latent image of each digit of the wafer-identifying information. In addition to this, under the control of the controller 25, the mask storage controller 22 and the mask transfer device 23 act to select a mask 30 for device location information, and then an exposure to light for forming the latent image of the device location information is carried out using the selected mask 30.

Furthermore, in this embodiment, when performing exposure to light for forming the latent image of wafer-identifying information, a positional relationship between a wafer 1 and a mask 30 is changed for each digit of the wafer-identifying information, so that the numeral or symbol of each digit of the wafer-identifying information is imprinted at a mutually different position in the region corresponding to devices 2 in a wafer 1. Additionally, when performing exposure to light for forming the latent image of device location information, a positional relationship between a wafer 1 and a mask 30 is set such that the device location number is imprinted at a position different from that of the wafer-identifying information in the region corresponding to devices 2 in a wafer 1.

FIGS. 9A to 9E illustrate an example of change in the aforementioned positional relationship between the wafer 1 and the mask 30. In this example, it is assumed that the wafer-identifying information consists of four digits. In FIGS. 9A to 9E, the digits of the wafer-identifying information are indicated by reference numerals 3a, 3b, 3c, and 3d, in the order of decreasing significance. It is also assumed in this example that the device location information consists of four digits. In FIGS. 9A to 9E, the device location information is indicated by reference numeral 4e.

Figure 9A:
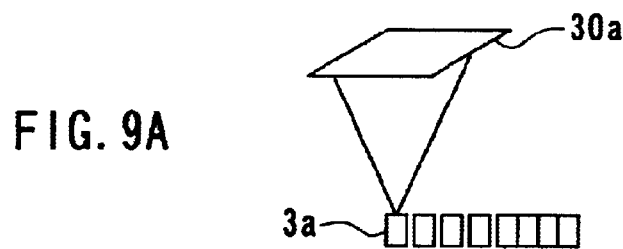
FIG. 9A to FIG. 9E are explanatory views illustrating an example of variation in the positional relationship between a mask and a wafer in the embodiment of the invention.
Figure 9B:
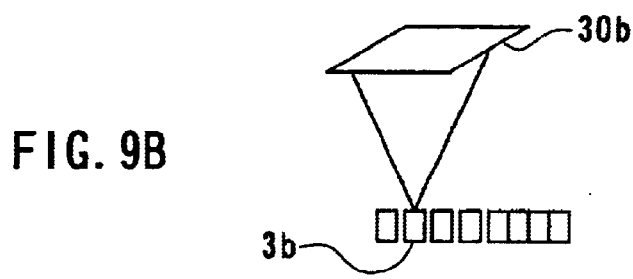
Figure 9C:
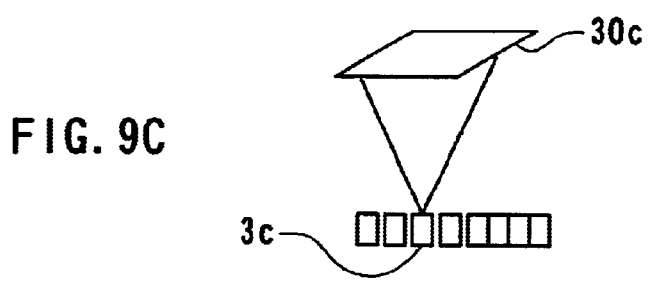
Figure 9D:
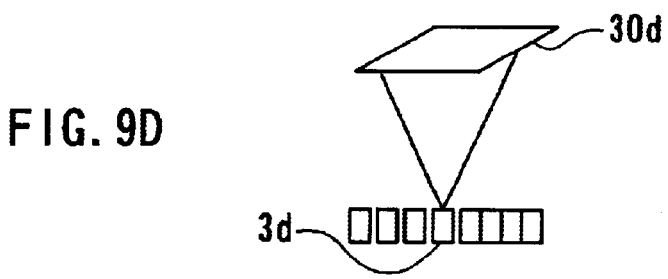
Figure 9E:
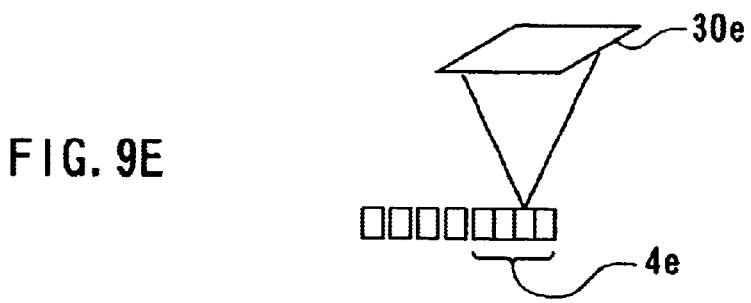

In the example shown in FIGS. 9A to 9E, exposure to light for forming the latent image of each of the digits of the wafer-identifying information is carried out sequentially, from the most significant digit 3a to the least significant digit 3d, using masks 30a, 30b, 30c and 30d, respectively, as shown in FIGS. 9A to 9D. Then, as shown in FIG. 9E, exposure to the light for forming the latent image of the device location information 4e is carried out using a mask 30e. The positions of the masks 30a–30e are changed for each pattern at the exposures so that the numerals or symbols of the digits 3a–3d of the wafer-identifying information and the device location number 4e are imprinted at positions different from each other in the region corresponding to devices 2 in the wafer 1. It is possible to arbitrarily determine the order of the exposures to light for forming the latent images of the digits 3a–3d of the wafer-identifying information and the exposure to light for forming the latent image of the device location number 4e. For example, it is possible to perform the exposures to light for forming the latent images of the digits 3a–3d in the order of increasing significance of the digits, after performing the exposure to light for forming the latent image of the device location number 4e. Although the position of each mask 30 is changed for each digit of the wafer-identifying information in this embodiment, it is also possible to change the position of the wafer 1 instead.

Now, the operation of the exposure apparatus according to this embodiment will be explained in detail with reference to the flowchart of FIG. 10. The operation shown in FIG. 10 corresponds to step S103 of FIG. 4 and step S113 of FIG. 6.

Figure 10:
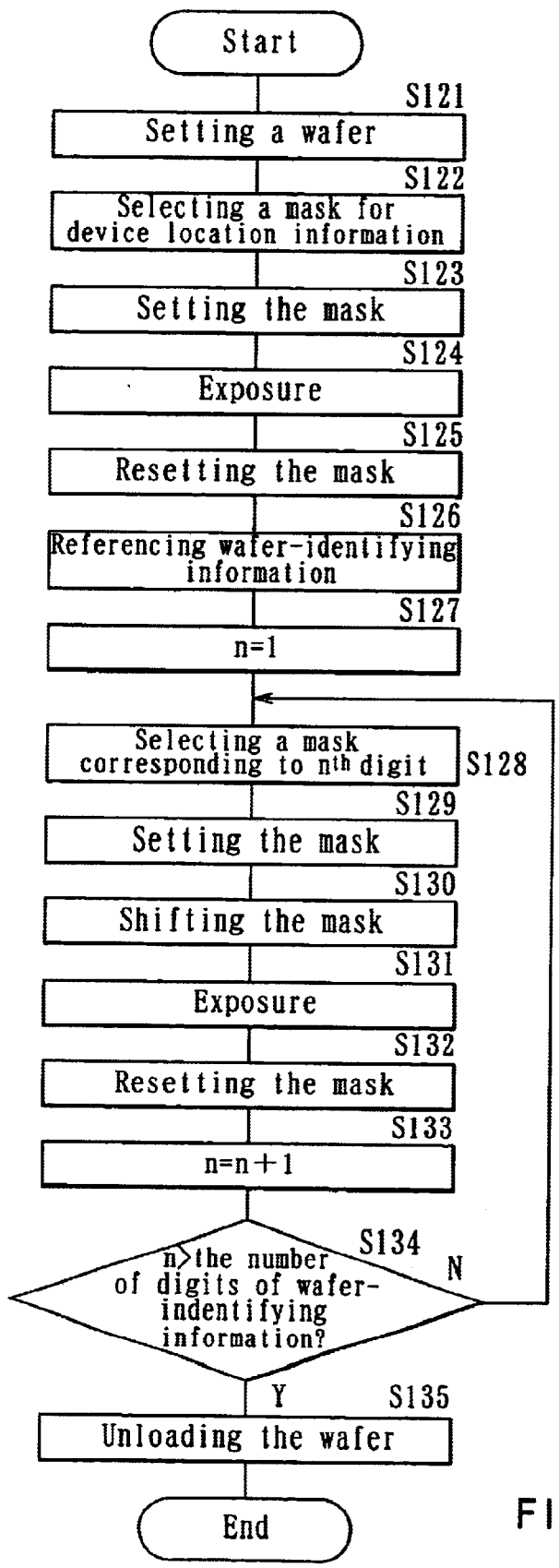
FIG. 10 is a flowchart illustrating the operation of the exposure apparatus according to the embodiment of the invention.
Figure 11:
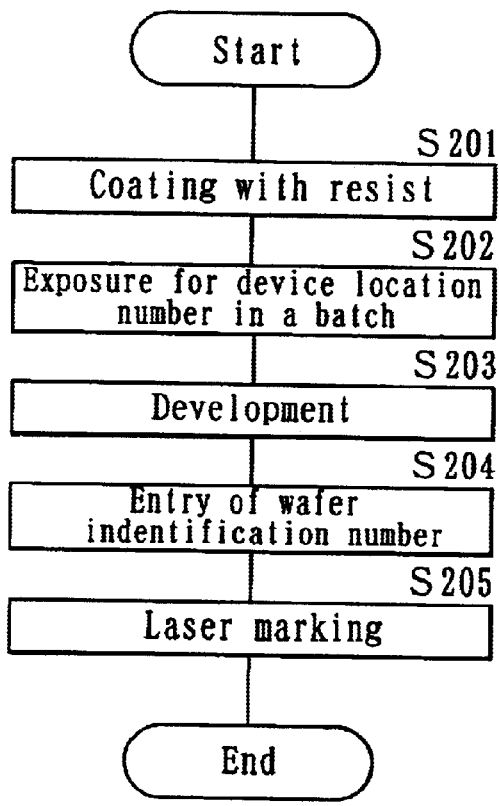
FIG. 11 is a flowchart illustrating an example of a method for imprinting wafer-identifying information and device location information on a wafer.
Figure 12:
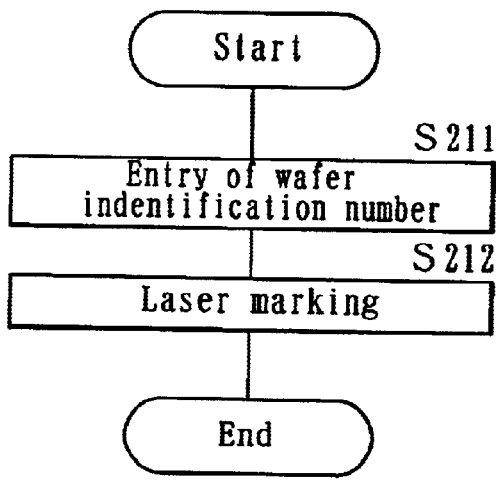
FIG. 12 is a flowchart illustrating another example of a method for imprinting wafer-identifying information and device location information on a wafer.
Figure 13:
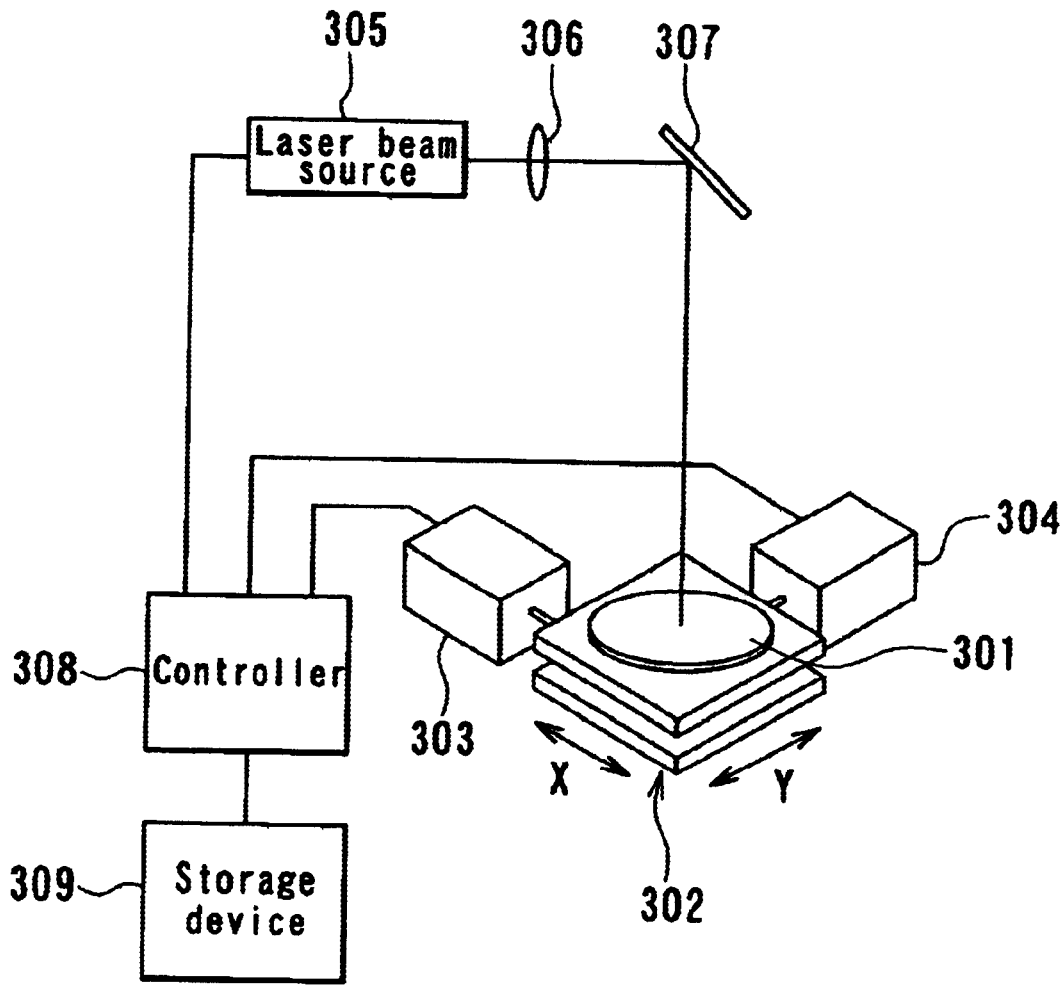
FIG. 13 is an explanatory view illustrating an exemplary configuration of a laser marking apparatus employed in each of the methods shown in FIGS. 11 and 12.

In the operation shown in FIG. 10, first, a wafer 1 to be exposed is set onto the wafer stage 12 (step S121). That is, under the control of the controller 25, the wafer storage controller 17 and the wafer transfer device 18 act to unload the wafer 1 to be exposed from the wafer storage device 16 and then to set (place) the wafer 1 onto the wafer stage 12. The wafer 1 has a resist layer that has been already formed thereon. The controller 25 sets the count value of the counter 26 to an initial value when performing exposure of a first wafer 1.

Then, under the control of the controller 25, the mask storage controller 22 and the mask transfer device 23 act to select a mask 30 for device location information among a plurality of masks 30 stored in the mask storage device 21 (step S122), and then set (place) the mask 30 onto the mask stage 13 (step S123). As the initial set position, the position of the mask stage 13 is set to such a position as to allow a predetermined position for imprinting the device location number to be exposed to light for forming the latent image of the device location number in the region corresponding to devices 2 in a wafer 1.

Then, using the mask 30 for device location information, the wafer 1 is exposed to light for forming the latent image of the device location number (step S124).

Subsequently, under the control of the controller 25, the mask storage controller 22 and the mask transfer device 23 act to unload the mask 30 for device location information from the mask stage 13 and then reset (store) the mask 30 into the mask storage device 21 (step S125).

Then, the controller 25 references the count value of the counter 26, i.e., the wafer-identifying information (step S126). The controller 25 then sets variable n to one (step S127).

Subsequently, under the control of the controller 25, the mask storage controller 22 and the mask transfer device 23 act to select a mask 30, on which the pattern of the numeral or symbol of the nth digit of the wafer-identifying information is drawn, from among a plurality of masks 30 stored in the mask storage device 21 (step S128). Then, the mask 30 is set (placed) onto the mask stage 13 (step S129). Then, under the control of the controller 25, the mask shift controller 24 adjusts the position of the mask stage 13 to shift the mask 30 so that the predetermined position for imprinting the $n^{th}$ digit of the wafer-identifying information is exposed to light for forming the latent image of the numeral or symbol of the $n^{th}$ digit in the region corresponding to devices 2 of the wafer 1 (step S130). The mask 30 provides a mutually different amount of shift for each digit of the wafer-identifying information. The amount of shift is stored in the controller 25.

Subsequently, using the mask 30 corresponding to the $n^{th}$ digit of the wafer-identifying information, the wafer 1 is exposed to light for forming the latent image of the numeral or symbol of the $n^{th}$ digit (step S131).

Then, under the control of the controller 25, the mask storage controller 22 and the mask transfer device 23 act to unload the mask 30 corresponding to the $n^{th}$ digit from the mask stage 13 to reset (store) the mask 30 in the mask storage device 21 (step S132).

Then, the controller 25 adopts n+1 as a new n (step S133). The controller 25 then determines whether the n has exceeded the number of digits of the wafer-identifying information (step S134). If the n has not exceeded the number of digits of the wafer-identifying information (N), the process returns to step S128 to perform the operations from step S128 to step S132 on the next digit of the wafer-identifying information, thereby exposing the numeral or symbol of the digit to the light for forming the latent image.

If the n has exceeded the number of digits of the wafer-identifying information (step S134: Y), the controller 25 provides the wafer storage controller 17 and the wafer transfer device 18 with an instruction to unload the wafer 1. This causes the wafer storage controller 17 and the wafer transfer device 18 to unload the wafer 1 from the wafer stage 12 to store the same in the wafer storage device 16 (step S135). With the aforementioned operations, the exposure operation of one wafer 1 is completed.

When providing the instruction to unload the wafer 1 to the wafer storage controller 17 and the wafer transfer device 18, the controller 25 sends the information on wafer change to the counter 26. Upon receiving the information on wafer change from the controller 25, the counter 26 increments or decrements the count value to update the wafer-identifying information.

If a plurality of wafers 1 are present in one lot, the operation shown in FIG. 10 is repeated as many times as the number of the wafers 1 contained in the lot. The aforementioned operation is automatically carried out by means of a program of the controller 25.

As described above, in the present embodiment, a mask 30 having the pattern of a numeral or symbol to be imprinted is drawn thereon is selected for each digit of wafer-identifying information to perform exposure using the selected mask 30. Therefore, according to this embodiment, the number of exposures to be performed for imprinting wafer-identifying information and device location information is equal to the sum of the number of digits of the wafer-identifying information and 1. For example, if the wafer-identifying information consists of four digits, the number of exposures to be performed is 4+1=5.

Therefore, according to the present embodiment, wafer-identifying information and device location information may be imprinted in a short time. That is, excluding changes and positioning of masks 30, it normally takes only a few seconds to perform one exposure. Even if changes and positioning of masks 30 are included, it takes a few minutes (e.g., about 2 minutes) to perform one exposure. Therefore, when the wafer-identifying information consists of four digits, i.e., exposure is performed five times for one wafer, it takes only about 10 minutes to perform the exposure for one wafer.

Thus, the present embodiment greatly reduces the time required for exposure for imprinting wafer-identifying information and device location information, compared to the conventional methods employing laser marking (several minutes to several hours).

Furthermore, according to the conventional methods employing laser marking, the time required for the marking would increase as the number of devices in a wafer is increased. In contrast, according to the present embodiment the time required for exposure does not increase even if the number of devices in a wafer is increased. Therefore, the aforementioned effect of this embodiment become more noticeable as the devices are made smaller in size or the wafer is made larger so that the number of devices in a wafer increases. From the foregoing, the method for imprinting wafer-identifying information and the exposure method and apparatus for imprinting wafer-identifying information according to this embodiment are suitable for a device manufacturing process such as the manufacturing process of thin-film magnetic heads in which a wafer contains a number of devices and processing is performed in large quantity.

Additionally, in the present embodiment, the number of the masks 30 required for exposures for imprinting wafer-identifying information and device location information is equal to the sum of the number of the numerals or symbols available for each digit of the wafer-identifying information, i.e., the radix M where the wafer-identifying information is expressed by the base-M system, and 1. For example, if the wafer-identifying information is expressed by the base-ten system, the number of the masks 30 required is 10+1=11. If the wafer-identifying information is expressed by the base-M system and consists of N digits, the number of values that can be expressed as the wafer-identifying information is equal to the value M to the power of N. For example, if the wafer-identifying information is expressed by the base-ten system and consists of 4 digits, the wafer-identifying information can have 10,000 selections of values. Therefore, the present embodiment makes it possible to express a number of varieties of wafer-identifying information without requiring many masks 30.

From the foregoing, the present embodiment makes it possible to imprint wafer-identifying information and device location information on a wafer 1, on which a plurality of devices 2 are formed in a batch, in a short time without requiring a number of varieties of the mask 30 to be used for exposure.

Furthermore, in the present embodiment, when performing exposure to light for forming the latent image of wafer-identifying information, the positional relationship between the wafer and the mask is changed for each digit of the wafer-identifying information, so that the numeral or symbol of each digit of the wafer-identifying information is imprinted at a mutually different position. Accordingly, this embodiment makes it possible to use a plurality of masks 30 in common to a plurality of digits of the wafer-identifying information.

The present invention is not limited to the foregoing embodiment but is susceptible of various modifications. For example, in the foregoing embodiment, device location information is also imprinted in the step of imprinting wafer-identifying information; however, the wafer-identifying information and the device location information may be imprinted in different steps. In this case, the wafer-identifying information and the device location information are imprinted using different layers.

In addition, if the numerals or symbols in some of the digits of the wafer-identifying information are changeable from wafer to wafer and those in the other digits do not change, imprinting of these two different types of digits may be performed in different steps. In this case, at least for the digits in which the numerals or symbols are changeable from wafer to wafer, exposure is performed by selecting a mask for each of the digits. If there exist a plurality of digits in which the numerals or symbols do not change from wafer to wafer, exposure may be performed for each of the digits by selecting a mask, or exposure may be performed for the plurality of digits at the same time, using a mask on which drawn is the pattern of the numerals or symbols of the plurality of digits.

As described above, in the method for imprinting wafer-identifying information and the exposure method and apparatus for imprinting wafer-identifying information of the invention, exposure is performed for each digit of the wafer-identifying information in which the numeral or the symbol is changeable wafer by wafer, by selecting a mask on which a pattern of a numeral or the symbol to be imprinted is drawn thereon for each digit. Therefore, the present invention makes it possible to imprint wafer-identifying information on a wafer, on which a plurality of thin-film devices are formed in a batch, in a short time without requiring a number of varieties of a mask for exposure.

Furthermore, in the method for imprinting wafer-identifying information and the exposure method and apparatus for imprinting wafer-identifying information, the positional relationship between a mask and a wafer may be changed for each digit of the wafer-identifying information, so that the numeral or symbol of each digit of the wafer-identifying information is imprinted at a mutually different position. In this case, it becomes possible to use a plurality of masks for wafer-identifying information in common to a plurality of digits of the wafer-identifying information.

Obviously many modifications and variations of the present invention are possible in the light of the above teachings. It is therefore to be understood that within the scope of the appended claims the invention may be practiced otherwise than as specifically described.

What is claimed is:

1. A method for imprinting wafer-identifying information using a patterned resist layer, on wafers each having a plurality of thin-film devices formed thereon in a batch, the wafer-identifying information including a plurality of digits, each digit being expressed with a numeral or a symbol, the method comprising the steps of:

selecting a wafer to be imprinted with the wafer-identifying information;

forming a resist layer on the selected wafer;

exposing the resist layer, using a mask, to light for forming a latent image of the wafer-identifying information; and forming the patterned resist layer by developing the exposed resist layer, wherein:

in the step of exposing the resist layer, exposure is performed for each digit of the wafer-identifying information in which the numeral or the symbol is changeable wafer by wafer, by selecting a mask on which a pattern of a numeral or the symbol to be imprinted is drawn thereon for each digit; and in the step of exposing the resist layer, the selection of a mask on which the pattern of a numeral or the symbol to be imprinted is drawn thereon and the exposure using the selected mask are repeated as many times as the number of digits of the wafer-identifying information, so that exposure is performed for all digits of the wafer-identifying information.

2. The method for imprinting wafer-identifying information according to claim 1, wherein:

in the step of exposing the resist layer, the resist layer is further exposed to light for forming a latent image of device location information for identifying a position of a thin-film device in the wafer, using a mask on which a pattern of the device location information is drawn thereon.

3. The method for imprinting wafer-identifying information according to claim 1, wherein:

the numeral or symbol of each digit of the wafer-identifying information varies in accordance with a certain rule in response to change of one selected wafer to another, and in the step of exposing the resist layer, one selected mask is changed to another in response to the change of one selected wafer to another in such a manner as to correspond to the rule of the variation of the numeral or symbol of each digit of the wafer-identifying information.

4. The method for imprinting wafer-identifying information according to claim 1, wherein:

in the step of exposing the resist layer, a positional relationship between the mask and the wafer is changed for each digit of the wafer-identifying information, so that the numeral or symbol of each digit of the wafer-identifying information is imprinted at a mutually different position.

5. The method for imprinting wafer-identifying information according to claim 1, further comprising the step of etching a layer underlying the patterned resist layer, using the patterned resist layer as an etching mask.

6. The method for imprinting wafer-identifying information according to claim 1, further comprising the step of forming a plating layer by performing plating with the patterned resist layer used as a frame.

7. An exposure method for imprinting wafer-identifying information that is used for imprinting wafer-identifying information using a patterned resist layer on wafers each having a plurality of thin-film devices formed thereon in a batch, the wafer-identifying information including a plurality of digits, each digit being expressed with a numeral or a symbol, the exposure method exposing the patterned resist layer formed on the wafer to light for forming a latent image of the wafer-identifying information, and comprising the steps of:

selecting a wafer to be imprinted with the wafer-identifying information, and exposing the resist layer of the selected wafer, using a mask, to the light for forming the latent image of the wafer-identifying information, wherein:

in the step of exposing the resist layer, exposure is performed for each digit of the wafer-identifying information in which the numeral or the symbol is changeable wafer by wafer, by selecting a mask on which a pattern of a numeral or the symbol to be imprinted is drawn thereon for each digit; and in the step of exposing the resist layer, the selection of a mask on which the pattern of a numeral or the symbol to be imprinted is drawn thereon and the exposure using the selected mask are repeated as many times as the number of digits of the wafer-identifying information, so that exposure is performed for all digits of the wafer-identifying information.

8. The exposure method for imprinting wafer-identifying information according to claim 7, wherein:

in the step of exposing the resist layer, the resist layer is further exposed to light for forming a latent image of device location information for identifying a position of a thin-film device in the wafer, using a mask on which a pattern of the device location information is drawn thereon.

9. The exposure method for imprinting wafer-identifying information according to claim 7, wherein:

the numeral or symbol of each digit of the wafer-identifying information varies in accordance with a certain rule in response to change of one selected wafer to another, and in the step of exposing the resist layer, one selected mask is changed to another in response to the change of one selected wafer to another in such a manner as to correspond to the rule of the variation of the numeral or symbol of each digit of the wafer-identifying information.

10. The exposure method for imprinting wafer-identifying information according to claim 7, wherein:

in the step of exposing the resist layer, a positional relationship between the mask and the wafer is changed for each digit of the wafer-identifying information, so that the numeral or symbol of each digit of the wafer-identifying information is imprinted at a mutually different position.

11. An exposure apparatus for imprinting wafer-identifying information that is used for imprinting wafer-identifying information using a patterned resist layer on wafers each having a plurality of thin-film devices formed thereon in a batch, the wafer-identifying information including a plurality of digits, each digit being expressed with a numeral or a symbol, the exposure apparatus exposing the patterned resist layer formed on the wafer to light for forming a latent image of the wafer-identifying information, and comprising:

a wafer selecting device for selecting a wafer to be imprinted with the wafer-identifying information, and an exposure device for exposing the resist layer of the wafer selected by the wafer selecting device, using a mask, to the light for forming the latent image of the wafer-identifying information, wherein:

the exposure device has a mask selecting device for selecting a mask on which a pattern of a numeral or symbol to be imprinted is drawn thereon for each digit of the wafer-identifying information in which the numeral or the symbol is changeable wafer by wafer.

12. The exposure apparatus for imprinting wafer-identifying information according to claim 11, wherein the exposure device repeats the selection of a mask on which the pattern of a numeral or the symbol to be imprinted is drawn thereon and the exposure using the selected mask as many times as the number of digits of the wafer-identifying information, so as to perform exposure for all digits of the wafer-identifying information.

13. The exposure apparatus for imprinting wafer-identifying information according to claim 11, wherein the exposure device further exposes the resist layer to light for forming a latent image of device location information for identifying a position of a thin-film device in the wafer, using a mask on which a pattern of the device location information is drawn thereon.

14. The exposure apparatus for imprinting wafer-identifying information according to claim 11, wherein:

the numeral or symbol of each digit of the wafer-identifying information varies in accordance with a certain rule in response to change of one selected wafer to another, and the mask selecting device changes one selected mask to another in response to the change of one selected wafer to another in such a manner as to correspond to the rule of the variation of the numeral or symbol of each digit of the wafer-identifying information.

15. The exposure apparatus for imprinting wafer-identifying information according to claim 11, wherein the exposure device further has a position changing device for changing a positional relationship between the mask and the wafer for each digit of the wafer-identifying information, so that the numeral or symbol of each digit of the wafer-identifying information is imprinted at a mutually different position.

* * * * *